United States Patent
Koyata et al.

(10) Patent No.: US 7,648,890 B2
(45) Date of Patent: Jan. 19, 2010

(54) PROCESS FOR PRODUCING SILICON WAFER

(75) Inventors: Sakae Koyata, Tokyo (JP); Tomohiro Hashii, Tokyo (JP); Katsuhiko Murayama, Tokyo (JP); Kazushige Takaishi, Tokyo (JP); Takeo Katoh, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 11/504,969

(22) Filed: Aug. 15, 2006

(65) Prior Publication Data

US 2007/0042567 A1    Feb. 22, 2007

(30) Foreign Application Priority Data

Aug. 17, 2005    (JP)    ............ P2005-236255

(51) Int. Cl.
*H01L 21/30* (2006.01)
*H01L 21/46* (2006.01)

(52) U.S. Cl. ............ 438/459; 257/E21.214; 257/E21.219; 216/52; 216/91

(58) Field of Classification Search ......... 216/38, 216/52, 92, 99; 438/690, 748, 749, 753
See application file for complete search history.

(56) References Cited

U.S. PATENT DOCUMENTS

| | | | | |
|---|---|---|---|---|
| 5,800,725 A * | 9/1998 | Kato et al. | ............ | 216/88 |
| 5,942,449 A * | 8/1999 | Meikle | ............ | 438/747 |
| 6,294,469 B1 * | 9/2001 | Kulkarni et al. | ............ | 438/689 |
| 6,787,797 B2 * | 9/2004 | Demizu et al. | ............ | 257/48 |
| 2001/0039119 A1 * | 11/2001 | Kishimoto | ............ | 438/690 |
| 2002/0034881 A1 * | 3/2002 | Kulkarni et al. | ............ | 438/753 |
| 2003/0171075 A1 * | 9/2003 | Nihonmatsu et al. | ............ | 451/41 |
| 2004/0108297 A1 * | 6/2004 | Erk et al. | ............ | 216/2 |
| 2004/0222416 A1 | 11/2004 | Teuschler et al. | | |
| 2006/0252272 A1 * | 11/2006 | Koyata et al. | ............ | 438/745 |
| 2007/0267387 A1 | 11/2007 | Koyata et al. | | |

(Continued)

FOREIGN PATENT DOCUMENTS

DE    10302611 A1    8/2004

(Continued)

OTHER PUBLICATIONS

An Extended European Search Report from corresponding European Application No. EP06016964, dated Apr. 8, 2008.

(Continued)

*Primary Examiner*—Allan Olsen
(74) *Attorney, Agent, or Firm*—Kolisch Hartwell, P.C.

(57) ABSTRACT

A process for producing a silicon wafer comprising a single-wafer etching step of performing an etching by supplying an etching solution through a supplying-nozzle to a surface of a single and a thin-discal wafer obtained by slicing a silicon single crystal ingot and rotating the wafer to spread the etching solution over all the surface of the wafer; and a grinding step of grinding the surface of the wafer, in this order, wherein the etching solution used in the single-wafer etching step is an aqueous acid solution which contains hydrogen fluoride, nitric acid, and phosphoric acid in an amount such that the content of which by weight % at a mixing rate of fluoric acid:nitric acid:phosphoric acid is 0.5 to 40%:5 to 50%:5 to 70%, respectively.

7 Claims, 11 Drawing Sheets

U.S. PATENT DOCUMENTS

2008/0057714 A1 3/2008 Teuschler et al.

FOREIGN PATENT DOCUMENTS

| EP | 1693887 A1 | | 8/2006 |
|----|------------|---|--------|
| JP | 11-135464 | * | 5/1999 |
| KR | 2003-31009 | | 4/2003 |
| TW | 514976 B | | 12/2002 |
| WO | 00/72367 A1 | | 11/2000 |
| WO | 02/03432 A2 | | 10/2002 |
| WO | 2005/057645 A1 | | 6/2005 |

OTHER PUBLICATIONS

An Office Action issued in corresponding Chinese Application No. 200610159243.5, with English language translation and letter from Chinese associate dated Jan. 25, 2008.

Korean Office Action issued on Jul. 18, 2007 in related Korean Application No. 10-2006-0076124.

Taiwan Patent Office; "Office Action" for TW 95129784; issued Sep. 11, 2009; includes English translation prepared by Applicants; 10 pages total. TW 95129784 is a foreign counterpart of U.S. Appl. No. 11/504,969.

Lin Ming-Shian; "Materials and Technology for Silicon Wafers and Semiconductors"; Dec. 1999; pp. 6-1 through 6-3, 6-36, 6-52, and Figure 6.1; published by Chuan-wha Technological Book Ltd; includes English translation prepared by Applicants; 11 pages total.

* cited by examiner

1div : 3.0 μm
Full Scale : 15.0 μm

1div : 1.0 μm
Full Scale : 5.0 μm

1div : 0.05 μm
Full Scale : 0.25 μm

1div : 3.0 μm
Full Scale : 15.0 μm

1div : 1.0 μm
Full Scale : 5.0 μm

PRIOR ART

1div : 0.5 μm
Full Scale : 2.5 μm

1div : 0.05 μm
Full Scale : 0.25 μm

PRIOR ART

1div : 3.0 μm
Full Scale : 15.0 μm

1div : 1.0 μm
Full Scale : 5.0 μm

PRIOR ART

1div : 0.5 μm
Full Scale : 2.5 μm

1div : 0.05 μm
Full Scale : 0.25 μm

PRIOR ART

PRIOR ART

PROCESS FOR PRODUCING SILICON WAFER

BACKGROUND OF THE INVENTION

1. Field of the Invention The present invention relates to a process for producing a silicon wafer, which is capable of highly flattening, without performing a flattening process by machine polishing such as grinding, lapping, etc.

Priority is claimed on Japanese Patent Application No. 2005-236255, filed Aug. 17, 2005, the content of which is incorporated herein by reference.

2. Description of the Related Art

In general, a production process of a semiconductor silicon wafer consists of chamfering, machine polishing such as lapping and grinding, etching, mirror finishing (polishing), and washing of a wafer which is obtained by cutting a pulled silicon single crystal ingot and slicing, thereby producing a wafer with high flatness.

In the conventional method, a wafer on which etching is finished is subjected to a mirror finishing process so as to be mirror-finished, however, the flatness between the top surface and the bottom surface of the wafer after being etched is not controlled when a flattening process such as grinding, lapping, etc. is finished. Moreover, desirable surface coarseness has not been obtained, and hence it is necessary to remove a large amount of silicon in thickness during the mirror-finishing process in order to improve the wafer flatness and wafer surface coarseness, thereby applying a large load to the mirror-finishing process.

Then, as a process for producing a silicon wafer which is capable of removing efficiently the process-strained layer generated by the machine polishing, while securing the flatness, a process is disclosed in for example Japanese Unexamined Patent Application, First Publication No. H11-135464(claim 1, FIG. 1), as shown in FIG. 16, the process comprising step 1 of slicing a silicon single crystal, step 2 of chamfering the end surface of the sliced wafer, step 3 of flattening by planar grinding or lapping at least a top surface of a wafer which is obtained by slicing a semiconductor ingot, step 4 of etching by spin-etching the top surface of the wafer which is flattened, and step 5 of grinding the top surface of the etched wafer to form a mirror-surface.

However, the method disclosed in Japanese Unexamined Patent Application, First Publication No. H11-135464 generates grinding-scratches which are caused by wafer-holding upon being ground by machine polishing during the flattening process, and waviness on the surface of the wafer, and as a result, it is necessary to remove a large amount of silicon in thickness during the mirror-finishing process in order to remove the grinding-scratches and waviness, thereby also applying a large load to the mirror-finishing process.

Thus, it is an object of the present invention to provide a process for producing a silicon wafer which is capable of performing a high level of flattening, without performing any flattening process using machine polishing such as grinding and lapping, which has been indispensable for the conventional manufacturing process, and of increasing productivity.

SUMMARY OF THE INVENTION

The inventors of the present invention have found that it is possible to attain the flatness which is equivalent to or greater than that of the conventional production process and to increase productivity by performing a single-wafer etching step and grinding process of a sliced wafer in this order under specific conditions, while omitting the flattening process using machine polishing such as grinding etc., which has been indispensable for the conventional production process of a wafer.

A first aspect of the present invention is, as shown in FIG. 1, a process for producing a silicon wafer comprising a single-wafer etching step of performing an etching by supplying an etching solution through a supplying-nozzle to a surface of a single and a thin-discal wafer obtained by slicing a silicon single crystal ingot and rotating said wafer to spread said etching solution over all surface of said wafer; and a grinding step 14 of grinding the surface of said wafer, in this order, wherein said etching solution used in said single-wafer etching step is an aqueous acid solution which contains hydrogen fluoride, nitric acid, and phosphoric acid in an amount such that the content of which by weight % at a mixing rate of fluoric acid:nitric acid:phosphoric acid is 0.5 to 40%:5 to 50%:5 to 70%, respectively.

In accordance with the first aspect of the present invention, it is possible to attain high flattening with wafer TTV of not more than 1 μm by performing the single-wafer etching step and the grinding step under the above conditions, without performing any flattening process using machinery polishing such as grinding and lapping, which has been indispensable for the conventional manufacturing process.

A second aspect of the present invention is a process for producing a silicon wafer as set forth in the first aspect of the present invention, in which the single-wafer etching step is a step of etching the bottom surface of the wafer after etching the top surface of the wafer.

A third aspect of the present invention is a process for producing a silicon wafer as set forth in the first aspect of the present invention, in which the resultant silicon wafer has a difference between the maximum value and the minimum value of thickness of not more than 1 μm.

A fourth aspect of the present invention is a process for producing a silicon wafer as set forth in the first aspect of the present invention, further comprising a chamfering step of chamfering the end surface of the silicon wafer between the single-wafer etching step and the grinding step.

DETAILED DESCRIPTION OF THE INVENTION

Next, an explanation will be given about an embodiment for conducting the present invention, based on the drawings.

First, both the top end and the bottom end of a grown silicon single crystal ingot are cut into a block-like shape, and the outer periphery of the resultant ingot is ground in order to uniformalize the diameter of the ingot to obtain a block body.

Figure 1:
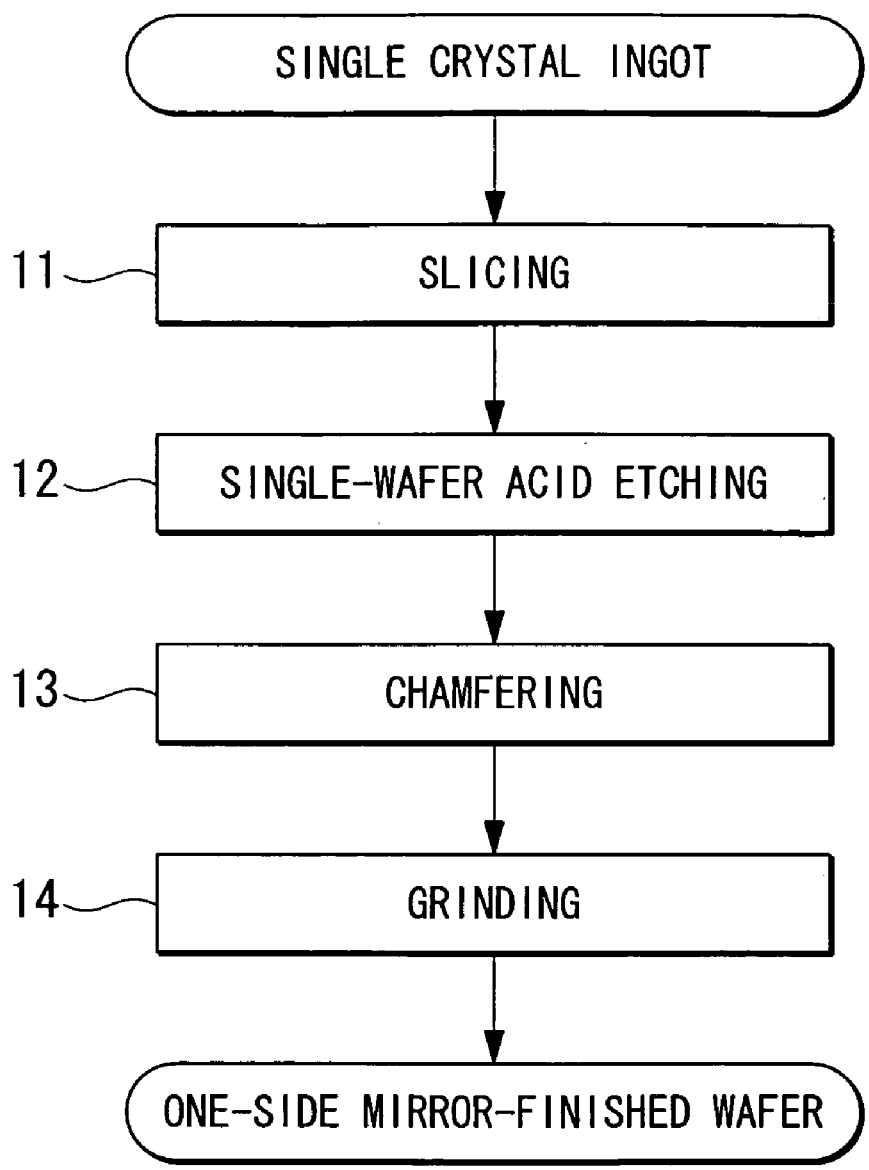
FIG. 1 is a figure showing the process for producing the silicon wafer in this embodiment.

In order to direct a specific crystal orientation, an orientation flat or an orientation notch is formed on this block body. As shown in FIG. 1, after this process, the resultant block body is sliced at a predetermined angle to the longitudinal direction of the block body in a cylindrical shape (step 11).

In the conventional wafer production process, subsequently, the unevenness on both surfaces of the thin-discal silicon wafer generated during processing such as slicing was removed by machine polishing such as grinding or lapping etc. to increase both the flatness and the parallelism between the top surface and the bottom surface of the wafer, however, in the production process in accordance with the present invention, without performing a flattening process by such a machinery polishing, an etching solution is supplied to the surface of a single silicon wafer through a supplying-nozzle, and the wafer is spun at a predetermined rotating rate, thereby extending the supplied etching solution over the whole surface of the wafer and etching the wafer (step 12). In single-wafer etching step 12 of the present invention, unevenness on both surfaces of the thin-discal silicon wafer generated during processing such as slicing is flattened by etching, thereby increasing both the flatness and the parallelism between the top surface and the bottom surface of the wafer. Moreover, the processing-deformation layer introduced by a machining process such as a block cutting, an outer diameter grinding, and a slicing step 11 is removed completely. Moreover, the texture size and the surface coarseness of a wafer are controlled by using an acid etching solution as an etching solution used for the single-wafer etching.

Figure 2:
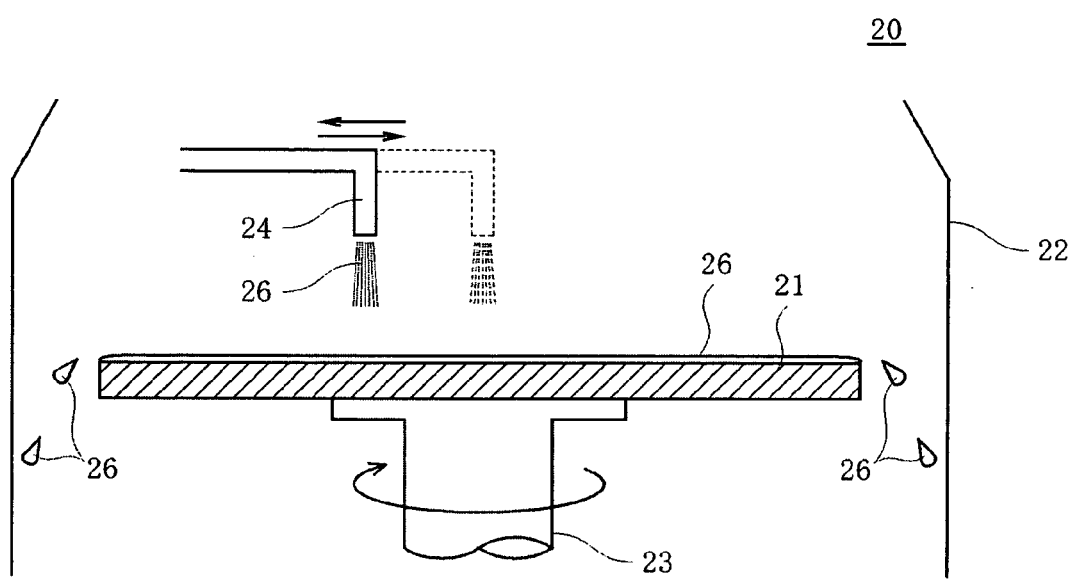
FIG. 2 is a figure showing a successive etching apparatus.

In this single-wafer etching step, a single-wafer etching apparatus 20 as shown in FIG. 2 is loaded with a silicon wafer 21. That is, the wafer 21 is horizontally held so that the wafer 21 surface will be the upper surface by a wafer chuck 23 of the vacuum suction type disposed in a cup 22. Subsequently, while moving horizontally an etching-solution-supplying-nozzle 24 disposed upward of the wafer 21, as shown by the solid line arrow in FIG. 2, and supplying an etching solution 26 to the upper surface of the wafer 21 from the etching-solution-supplying-nozzle 24, and by spinning the wafer 21 using the wafer chuck 23, the wafer surface is etched, thereby removing the processing-deformation layer on the surface of the wafer. The horizontal displacement of the supply nozzle 24 is performed at a rate ranging from 0.1 to 20 mm/second, from the wafer center in the radial direction of the wafer, rocking along with the circle drawn by the horizontal displacement of the nozzle 24 while using the supply nozzle 24 end as a fulcrum, or by reciprocating the nozzle 24 from the wafer center to the radial direction of the wafer. The etching solution 26 supplied to the upper surface of the wafer 21 moves gradually on the surface of a wafer from the wafer center to a wafer perimeter by the centrifugal force of wafer rotation, while etching the processing-deformation layer, thereby forming a droplet 26 and dispersing it from the perimeter edge of the wafer.

The etching solution 26 used in the single-wafer etching step of the present invention is an aqueous solution which contains fluoric acid, nitric acid, and phosphoric acid. Moreover, the mixing percentage of each of fluoric acid, nitric acid, and phosphoric acid contained in an aqueous solution is restricted such that fluoric acid:nitric acid:phosphoric acid is 0.5 to 40%:5 to 50%:5 to 70% by weight %. By compounding it as in the above mixing percentage, the viscosity of the etching solution 26 becomes 2 to 40 mPa·sec, and the surface tension of the etching solution 26 becomes 50 to 70 dyne/cm, and hence it is preferable for increasing the flatness and the parallelism between the top surface and the bottom surface of the wafer.

If the viscosity is less than the lower limit, then the viscosity of the solution is too low and the etching solution applied onto the surface of the wafer will flow away immediately from the surface of the wafer, such that the etching solution cannot come into contact with the surface of the wafer uniformly and sufficiently, and as a result it takes a long time for etching sufficiently, thereby deteriorating the productivity. On the other hand, if the viscosity is more than the upper limit, then the etching solution applied onto the surface of the wafer will stay on the surface of the wafer for a longer time than necessary, and hence it becomes impossible to control the shape in the surface and the shape of perimeter of the wafer, thereby deteriorating the flatness of the wafer. If the surface tension is less than the lower limit, then the etching solution applied onto the surface of the wafer will flow away immediately from the surface of the wafer, such that the etching solution cannot come into contact with the surface of the wafer uniformly and sufficiently, and as a result it takes a long time for etching sufficiently, thereby deteriorating the productivity. On the other hand, if the surface tension is more than the upper limit, then the etching solution applied onto the surface of the wafer will stay on the surface of the wafer for a longer time than necessary, and hence it becomes impossible to control the shape in the surface and the shape of perimeter of the wafer, thereby deteriorating the flatness of the wafer.

The mixing percentage of fluoric acid, nitric acid, phosphoric acid contained in the etching solution is preferably 5 to 20%:20 to 40%:20 to 40%, respectively. By compounding it as this mixed percentage, the viscosity of the etching solution becomes 10 to 25 mPa·sec., and the surface tension of the etching solution becomes 55 to 60 dyne/cm. The supplied amount of the etching solution 26 from the etching-solution-supplying nozzle 24 preferably ranges from 2 to 30 liter/min. In the case in which a silicon wafer is φ300 mm, the supplied amount of the acid etching solution 26 preferably ranges from 5 to 30 liter/min., whereas in the case in which a silicon wafer is φ200 mm, the supplied amount of the acid etching solution 26 preferably ranges from 3 to 20 liter/min.

The rotating speed of the wafer 21 in the single-wafer etching step 12 of the present invention is restricted to range from 100 to 2000 r.p.m. It should be noted that the optimal rotating speed varies a little, depending on the diameter of the wafer 21, the viscosity of the etching solution 26, the position of supplying the etching solution 26 due to the horizontal displacement of the supplying nozzle 24, and the supplied amount of the etching solution 26. If the rotating speed is less than the lower limit, then it becomes impossible to control the shape in the surface and the shape of perimeter of the wafer, thereby deteriorating the flatness of the wafer. On the other hand, if the rotating speed is more than the upper limit, then the etching solution applied onto the surface of the wafer will flow away immediately from the surface of the wafer, such that the etching solution cannot come into contact with the surface of the wafer uniformly and sufficiently, and as a result it takes a long time for etching sufficiently, thereby deteriorating the productivity. In the case in which a silicon wafer is φ300 mm, the rotating speed preferably ranges from 200 to 1500 r.p.m., more preferably 600 r.p.m., and in the case in which a silicon wafer is φ200, the rotating speed preferably ranges from 300 to 2000 r.p.m., more preferably 800 r.p.m.

Moreover, in this single-wafer etching step 12, after etching the top surface of the wafer, the bottom surface of wafer is etched successively, and as a result, both surfaces of the wafer will be etched equivalently, thereby increasing the parallelism between both surfaces. After etching the surface of the wafer 21, the etching solution 26 which remains on the wafer 21 surface is washed by spinning the wafer 21, while supplying rinsing liquid such as pure water to the upper surface of the wafer 21 by a rinsing-liquid-supplying nozzle which is not illustrated. After the washing, the wafer 21 is dried by spinning the wafer 21, while supplying inert gas such as nitrogen gas thereto, in the state of stopping the supply of the rinsing liquid. Subsequently, the wafer 21 is turned upside down and held by the wafer chuck 23 so that the bottom surface of the wafer 21 comes to the upper side, and then the etching step, rinsing liquid washing step, and drying step are performed similarly.

As for the amount removed by etching in this single-wafer etching process 12, it preferably ranges from 5 to 75 μm expressed in terms of one side, and it preferably ranges from 10 to 150 μm expressed in terms of the sum of both sides of the wafer. By setting the amount removed by etching into the above range, it is possible to increase the flatness and the parallelism between both surfaces of the wafer and to reduce remarkably the cost for the subsequent polishing step, compared to the conventional wafer production process. If the amount removed by etching is less than the lower limit, then it is not possible to obtain the flatness and the parallelism between both surfaces of wafer which is required in a product, and the wafer surface coarseness will not be sufficiently reduced, and hence the load applied to the polishing step is large, whereas if the amount removed by etching is more than the upper limit, then the flatness of the wafer will deteriorate, thereby decreasing productivity in wafer productions. By performing the single-wafer etching step 12 under the above conditions, the wafer surface coarseness and the texture size can be controlled, and hence it is possible to attain both maintaining of the wafer flatness and the reduction of wafer surface coarseness, while reducing the amount removed by polishing of both surfaces of the wafer during the subsequent polishing step 14.

Figure 3:
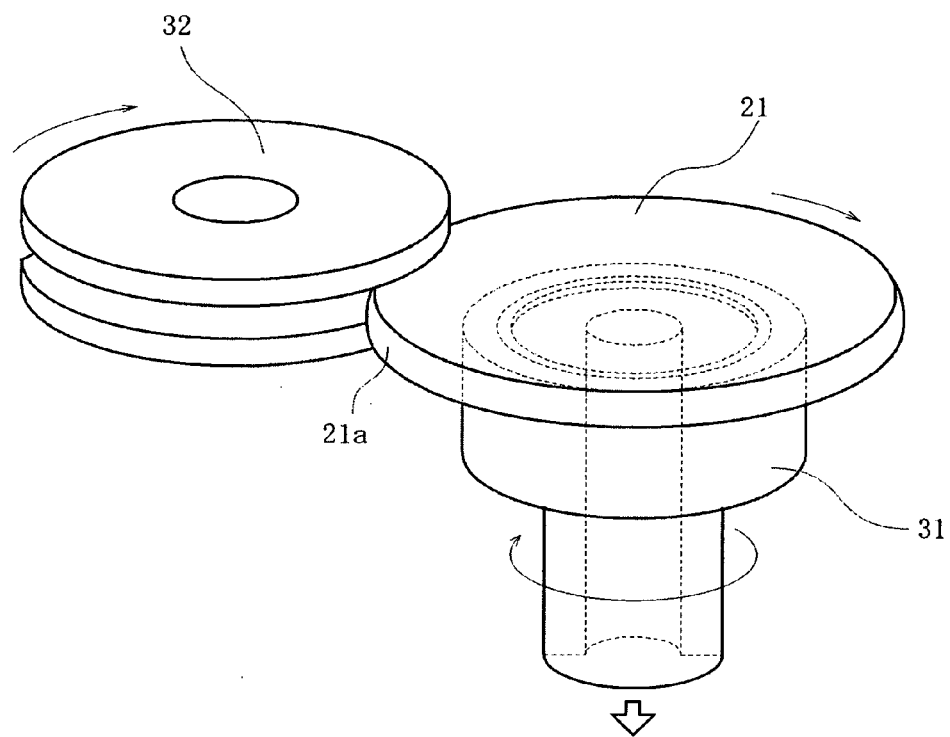
FIG. 3 is a perspective view showing the chamfering step.

Next, returning to FIG. 1, the wafer after being subjected to the single-wafer etching step 12 will be subjected to a chamfering step on the end surface of the wafer in order to prevent nicking and chipping at the circumference of the wafer (step 13). By performing this chamfering, it is possible to suppress the crown phenomenon an abnormal growth occurs on an end surface to swell like a ring when performing an epitaxial growth on the surface of a wafer which is not chamfered. Usually, the chamfering processing of a wafer is performed before the flattening of wafer so that neither a cutout nor a chip may occur in a wafer perimeter during the wafer flattening process such as lapping and surface grinding, however, in the present invention, the flattening process is omitted, and hence the chamfering process can be performed before and after the single-wafer etching process. In particular, it is possible to chamfer the end surface of a wafer by performing the chamfering step after the single-wafer etching step, while repairing the irregular shape of the wafer that occurred during the single-wafer etching step and without deforming the chamfering shape of the wafer due to etching processing. Specifically, as shown in FIG. 3, the wafer central part is adsorbed by a vacuum chuck 31, and the wafer 21 is held horizontally. The chamfering step is performed by contacting a grinding wheel 32 which is spinning with an end surface 21a of the wafer 21 which is being spun by the rotating driving part which is formed as one body together with the vacuum chuck 31. Moreover, this chamfering process may be performed by contacting a grinding tape with the wafer end surface at an arbitrary contact angle.

Figure 4:
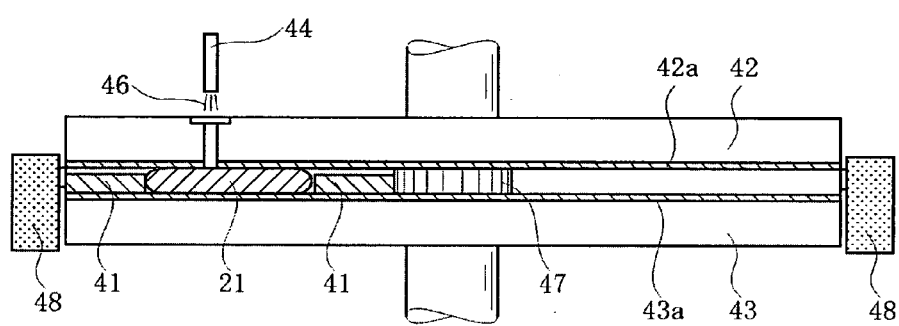
FIG. 4 is a figure showing a double-sided simultaneous polishing apparatus.

Next, returning to FIG. 1, grinding is performed on the surface of the silicon wafer (step 14). An explanation will be given as to a double-sided simultaneous grinding which grinds both surfaces of the wafer simultaneously. The double-sided simultaneous grinding is performed by a double-sided simultaneous polishing apparatus 40 as shown in FIG. 4. As shown in FIG. 4, first, a carrier plate 41 is engaged with each of a sun gear 47 and an internal gear 48 of the double-sided simultaneously polishing apparatus 40, and the silicon wafer 21 is set in the holder of the carrier plate 41. Thereafter, the silicon wafer 21 is held between an upper platen 42 which has a first abrasive cloth 42a adhered onto the grinding surface side thereof, and a lower platen 43 which has a second abrasive cloth 43a adhered onto the grinding surface side thereof. Both surfaces of the silicon wafer 21 are simultaneously ground to be mirror-finished, by making the carrier plate 41 move in a planetary motion using the sun gear 47 and the internal gear 48 and simultaneously rotating the upper platen 42 and the lower platen 43 in the relative direction, while supplying abrasives 46 from a nozzle 44. Since the silicon wafer on which the single-wafer etching step 12 mentioned above has been performed has the flatness approximately equivalent to that of a wafer when the flattening step is completed and desirable wafer surface coarseness, this double-sided simultaneously polishing step 14 can attain both maintenance of wafer flatness and reduction of wafer surface coarseness, in addition to reduction of the cost for grinding. Moreover, in accordance with this double-sided simultaneous polishing step 14, it is possible to obtain a double-sided mirror-finished wafer the top surface of which being distinguishable from the bottom surface thereof with viewing, by grinding simultaneously both faces of the silicon wafer while controlling each rotating speed of the upper platen 42 and the lower platen 43. The grinding-removing amount during this polishing step 14 preferably ranges from 1 to 15 micrometers expressed in terms of one-surface removing amount, and from 2 to 30 micrometers expressed in terms of the sum total removing amount.

Thus, a high flattening can be attained by performing the process for producing a silicon wafer of the present invention, without performing the flattening processing using the machine polishing, lapping, etc., which was indispensable for the conventional manufacturing process. Therefore, since grinding marks or the surge which had been conventionally generated during the mechanical flattening processing such as grinding etc. do not occur, it becomes unnecessary to secure a large amount of grinding amount to be removed during a mirror-finishing step, thereby increasing the productivity in wafer production significantly. In accordance with the production process of the present invention, a silicon wafer having the difference between the maximum thickness and the minimum thickness of not more than 1 μm can be obtained.

Moreover, although both the top surface and the bottom surface of the wafer are ground simultaneously by the double-sided simultaneous polishing in this embodiment, it is of course possible that the same effect can be obtained even if each of the top surface and the bottom surface of the wafer is ground one by one instead of this double-sided simultaneously polishing. Moreover, in order to increase the micro-roughness of the main surface of the wafer on which devices will be formed, one-side grinding may be performed on the main surface of the wafer which is subjected to the double-sided simultaneously polishing.

EXAMPLES

Next, Examples of the present invention will be explained in detail with Comparative Examples.

Example 1

Figure 5:
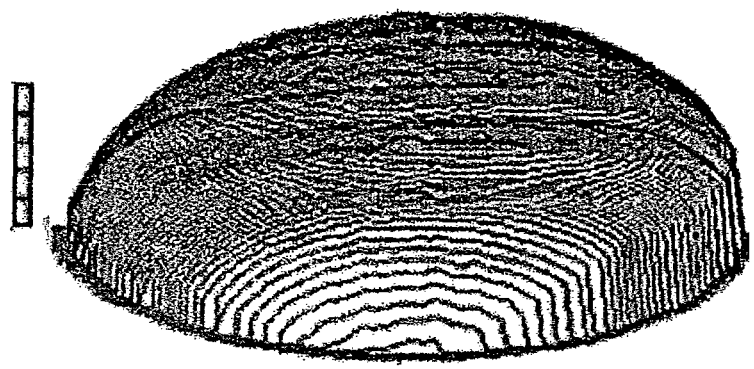
FIG. 5 is a figure showing the shape of the wafer surface after the slicing step of Example 1.
Figure 6:
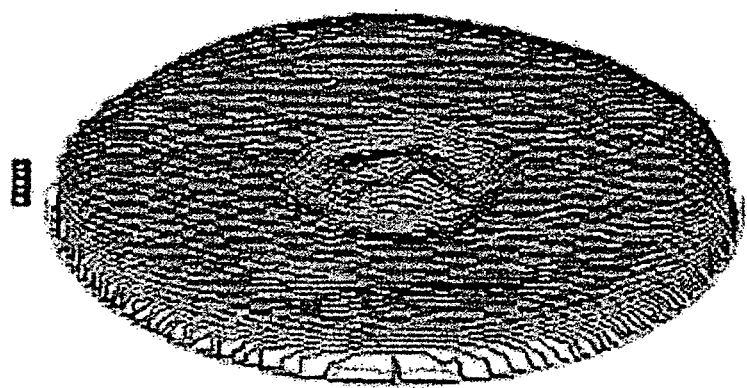
FIG. 6 is a figure showing the shape of the wafer surface after the single-wafer etching step of Example 1.
Figure 7:
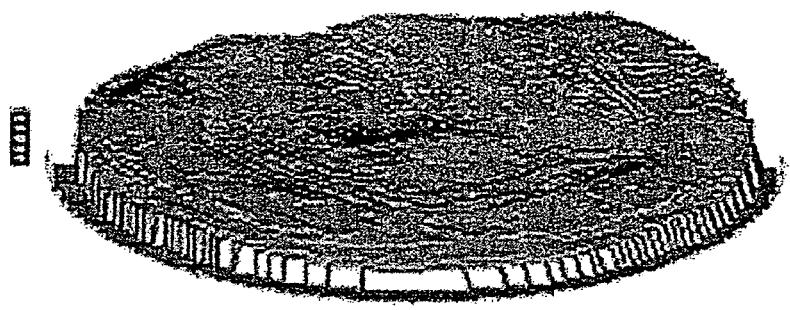
FIG. 7 is a figure showing the shape of the wafer surface after the double-sided simultaneous polishing step of Example 1.
Figure 8:
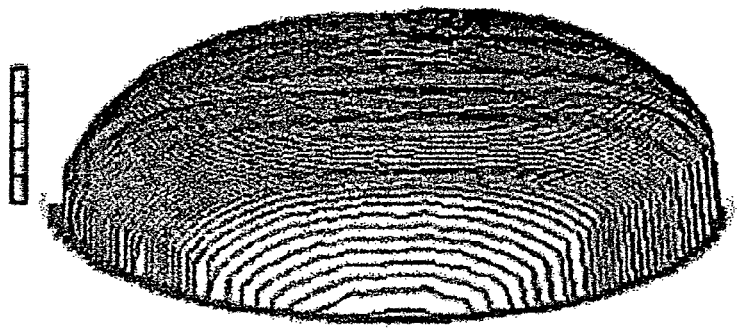
FIG. 8 is a figure showing the shape of the wafer surface after the slicing step of Comparative Example 1.
Figure 9:
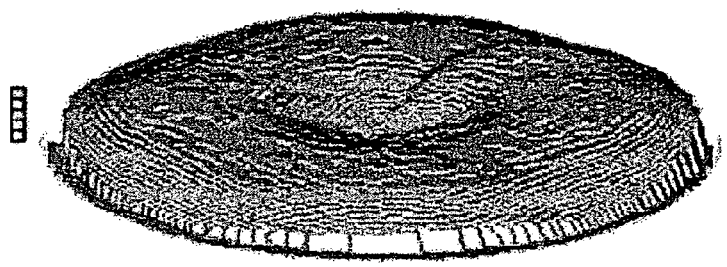
FIG. 9 is a figure showing the shape of the wafer surface after the DDSG step of Comparative Example 1.
Figure 10:
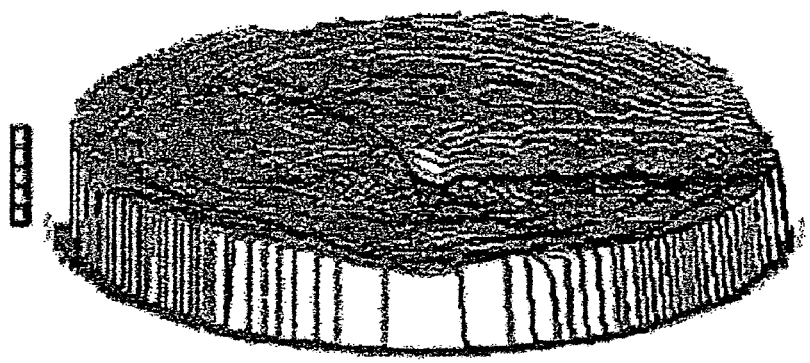
FIG. 10 is a figure showing the shape of the wafer surface after the SDSG step of Comparative Example 1.
Figure 11:
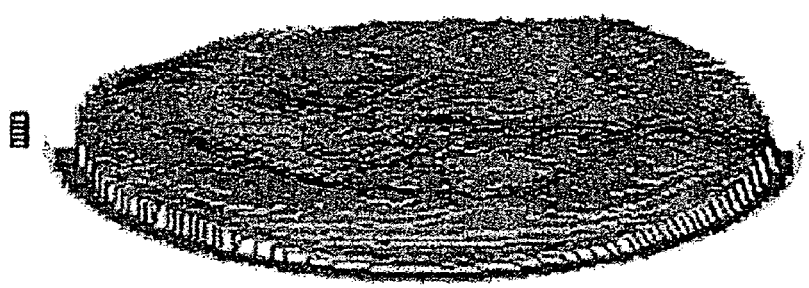
FIG. 11 is a figure showing the shape of the wafer surface after the double-sided simultaneous polishing step of Comparative Example 1.
Figure 12:
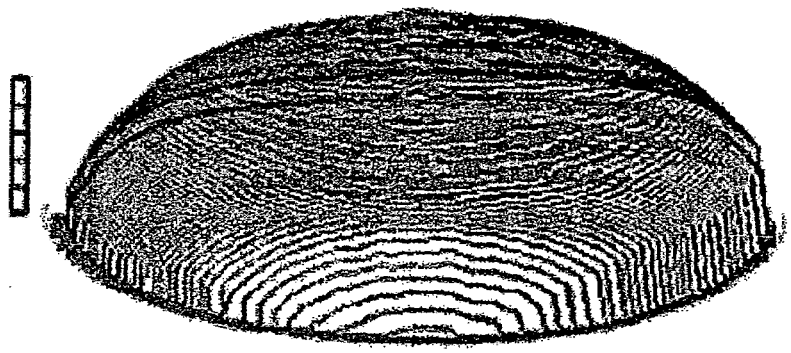
FIG. 12 is a figure showing the shape of the wafer surface after the slicing step of Comparative Example 2.
Figure 13:
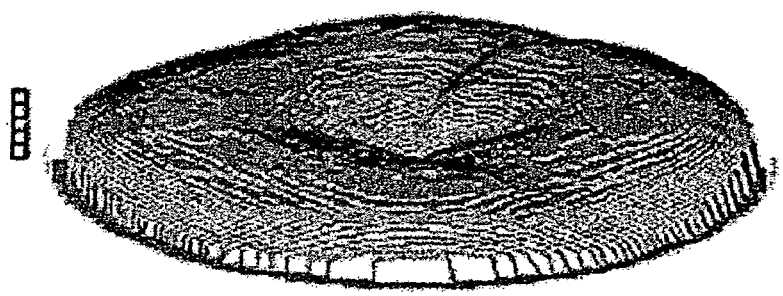
FIG. 13 is a figure showing the shape of the wafer surface after the DDSG step of Comparative Example 2.
Figure 14:
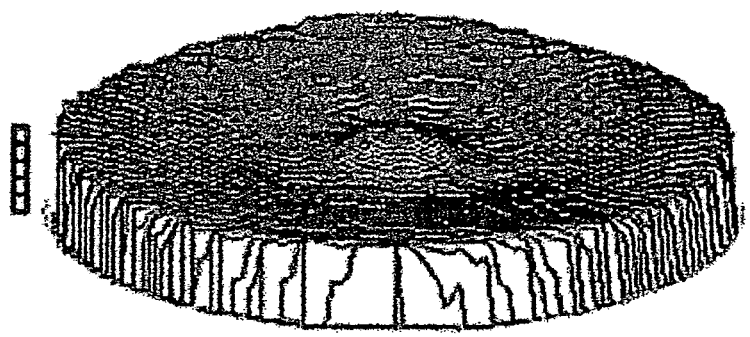
FIG. 14 is a figure showing the shape of the wafer surface after the single-wafer etching step of Comparative Example 2.
Figure 15:
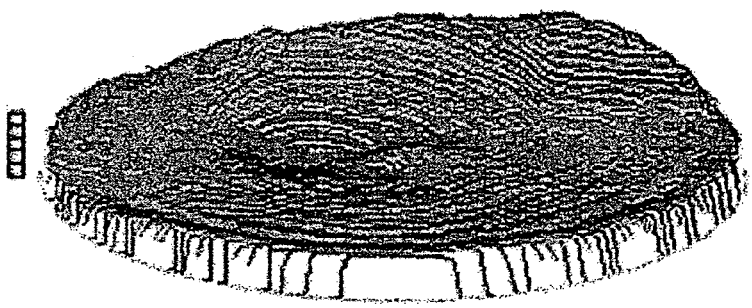
FIG. 15 is a figure showing the shape of the wafer surface after the double-sided simultaneous polishing step of Comparative Example 2.
Figure 16:
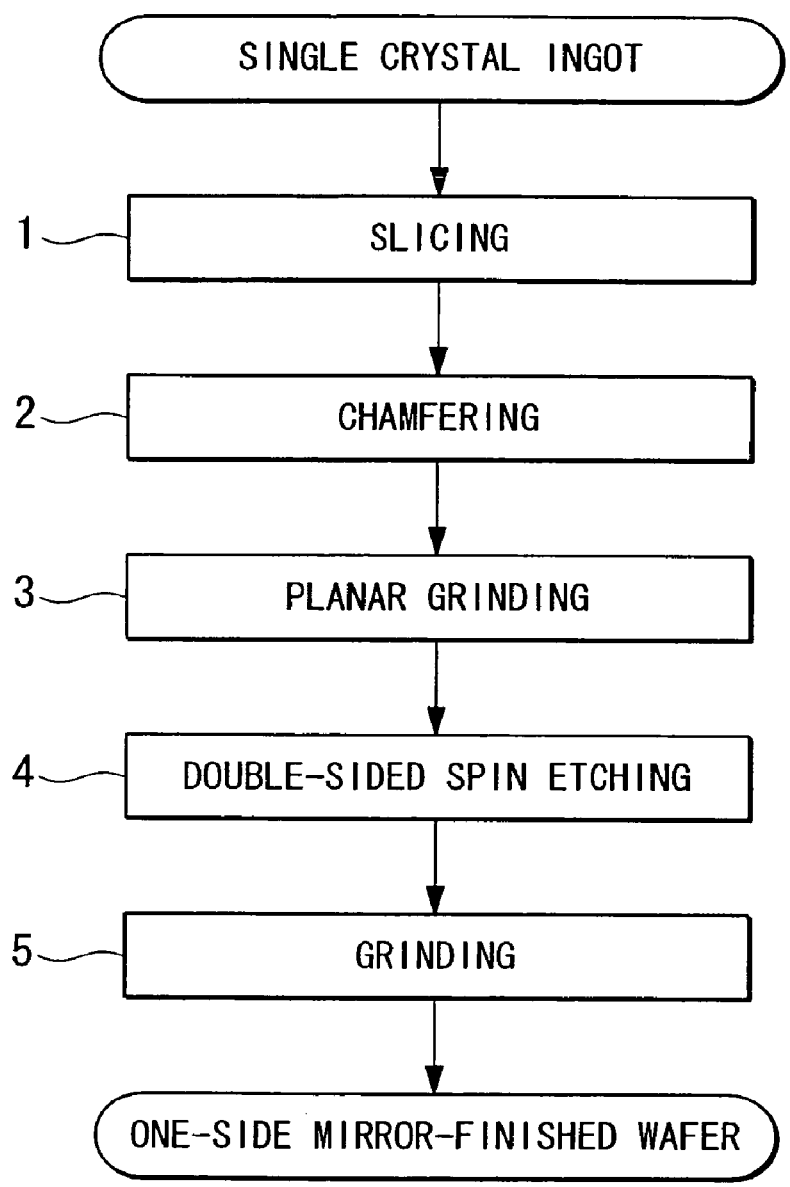
FIG. 16 is a figure showing a conventional process for producing a silicon wafer.

First, five pieces of ϕ300 mm silicon wafer were cut from a silicon single crystal ingot. Subsequently, a single-wafer etching was performed to the silicon wafer using the single-wafer etching apparatus shown in FIG. 2. As an etching solution, an acid etching solution which contained fluoric acid, nitric acid, phosphoric acid, at a mixing percentage of fluoric acid:nitric acid:phosphoric acid:water=7%:30%: 35%:28% respectively by weight % was used. Moreover, the wafer rotating speed in etching was controlled to be 600 r.p.m. and the flow rate of the etching solution to be supplied was controlled to be 5.6 liter/min., and etching was performed for 90 seconds. The amount removed by etching in the single-wafer acid etching was 30 μm on one side. After the etching, pure water was supplied to the wafer surface and washed, while spinning the wafer, and then nitrogen was blown onto the wafer surface to dry the wafer surface. Subsequently, the wafer was turned over, and the single-wafer acid etching was performed on the bottom surface of the wafer under the same conditions. Next, chamfering was performed on the end face of the wafer using the apparatus shown in FIG. 3. Furthermore, the double-sided simultaneous polishing was performed on both surfaces of the wafer using the double-sided simultaneous polishing apparatus shown in FIG. 5, while adjusting each rotating speed of the upper platen, the lower platen, the internal gear, and the sun gear, so that the amount removed by polishing in the double-sided simultaneous polishing might be 10 μm on one side. Five pieces of samples were subjected to mirror-finishing through the above steps.

Comparative Example 1

First, five pieces of ϕ300 mm silicon wafer were cut from a silicon single crystal ingot. Subsequently, as a flattening step, a double-disk-surface-grinding (referred to as "DDSG") was performed on both surfaces of the silicon wafer using a grinding apparatus which is not shown in drawings. The amount removed in this DDSG step was set to be 30 μm on one side. Thereafter, the one side grinding step (Single Disk Surface Grind; referred to as "SDSG process") was performed using a grinding apparatus which is not illustrated, and the amount removed in this SDSG process was set to be 20 μm on one side. Furthermore, the double-sided simultaneous polishing was performed on both surfaces of the wafer using the double-sided simultaneous polishing apparatus shown in FIG. 5, while adjusting each rotating speed of the upper platen, the lower platen, the internal gear, and the sun gear, so that the amount removed by polishing in the double-sided simultaneous polishing might be 10 μm on one side. Five pieces of samples were subjected to mirror-finishing through the above steps.

Comparative Example 2

First, five pieces of ϕ300 mm silicon wafer were cut from a silicon single crystal ingot. Subsequently, as a flattening step, a DDSG was performed on both surfaces of the silicon wafer using a lapping apparatus. The amount removed in this DDSG step was set to be 30 μm on one side. Thereafter, the single-wafer etching was performed on the flattened silicon wafer using the single-wafer etching apparatus shown in FIG. 2. As the etching solution, an acid etching solution was used which contained fluoric acid, nitric acid, phosphoric acid, and water at the mixing percentage of fluoric acid:nitric acid: phosphoric acid:water=7%:30%:35%:28% respectively by weight %.

Moreover, the wafer rotating speed in etching was controlled to be 600 r.p.m. and the flow rate of the etching solution to be supplied was controlled to be 5.6 liter/min., and etching was performed for 60 seconds. The amount removed by etching in the single-wafer etching was 20 μm on one side. After the etching, pure water was supplied to the wafer surface and washed, while spinning the wafer, and then nitrogen was blown onto the wafer surface to dry the wafer surface. Subsequently, the wafer was turned over, and the single-wafer etching was performed on the bottom surface of the wafer under the same conditions. Furthermore, the double-sided simultaneous polishing was performed on both surfaces of the wafer using the double-sided simultaneous polishing apparatus shown in FIG. 5, while adjusting each rotating speed of the upper platen, the lower platen, the internal gear, and the sun gear, so that the amount removed by polishing in the double-sided simultaneous polishing might be 10 μm on one side. Five pieces of samples were subjected to mirror-finishing through the above steps.

<Controlled Study 1>

TTV and wafer surface shape after each step in Example 1, Comparative Example 1, and Comparative Example 2 were evaluated. As for TTV, it was evaluated by absorbing and fixing each wafer with a vacuum suction pad, and measuring the maximum value and the minimum value of wafer thickness to obtain the difference therebetween as a TTV. TTV after each step is shown in Tables 1 to 3. Moreover, the average and standard deviation σ of samples 1 to 5 are shown in Tables 1 to 3. Moreover, the surface shape in the sample 1 of Example 1, Comparative Example 1, and Comparative Example 2 are shown in FIGS. 5 to 15, respectively.

TABLE 1

| | | TTV [μm] | | |
|---|---|---|---|---|
| | | After slicing | After single-wafer etching | After double-sided simultaneous grinding |
| Example 1 | Sample 1 | 9.757 | 2.145 | 0.272 |
| | Sample 2 | 10.101 | 2.237 | 0.276 |
| | Sample 3 | 10.456 | 2.389 | 0.288 |
| | Sample 4 | 10.330 | 2.175 | 0.251 |
| | Sample 5 | 9.866 | 2.059 | 0.253 |
| | Average of samples | 10.102 | 2.201 | 0.268 |
| | Standard deviation σ | 0.297 | 0.123 | 0.016 |

TABLE 2

| | | TTV [µm] | | | |
|---|---|---|---|---|---|
| | | After slicing | After DDSG step | After single-wafer etching | After double-sided simultaneous grinding |
| Comparative Example 2 | Sample 1 | 8.847 | 1.542 | 1.004 | 0.245 |
| | Sample 2 | 9.496 | 1.840 | 1.126 | 0.257 |
| | Sample 3 | 8.869 | 1.772 | 1.218 | 0.269 |
| | Sample 4 | 9.297 | 1.624 | 1.135 | 0.304 |
| | Sample 5 | 9.174 | 1.440 | 1.109 | 0.311 |
| | Average of samples | 9.137 | 1.644 | 1.118 | 0.277 |
| | Standard deviation σ | 0.279 | 0.164 | 0.077 | 0.029 |

TABLE 3

| | | TTV [µm] | | | |
|---|---|---|---|---|---|
| | | After slicing | After DDSG step | After SDSG step | After double-sided simultaneous grinding |
| Comparative Example 1 | Sample 1 | 9.433 | 1.618 | 1.130 | 0.255 |
| | Sample 2 | 9.612 | 1.845 | 0.929 | 0.251 |
| | Sample 3 | 8.990 | 1.488 | 0.910 | 0.312 |
| | Sample 4 | 9.144 | 1.673 | 1.185 | 0.302 |
| | Sample 5 | 9.675 | 1.560 | 1.040 | 0.294 |
| | Average of samples | 9.371 | 1.637 | 1.039 | 0.283 |
| | Standard deviation σ | 0.296 | 0.135 | 0.121 | 0.028 |

As is clear from Tables 1 to 3, it turns out that the TTV value after the double-sided simultaneous polishing step in Example 1 is by no means inferior to the TTV value after the double-sided simultaneous polishing step in Comparative Example 1 and Comparative Example 2. Moreover, as is clear from FIGS. 5 to 15, the wafer surface shape after each step in Example 1 gives a result which is by no means inferior to the wafer surface shape after each step in Comparative Examples 1 and 2, and it turns out that high flattening can be attained without performing flattening processing using machine polishing such as grinding and lapping, which had been indispensable step for the conventional process.

The process for producing the silicon wafer of the present invention has the advantage that high flattening can be attained, without performing a flattening processing which uses machine polishing such as grinding or lapping, etc., which had been indispensable for the conventional manufacturing process. Therefore, since grinding marks or the surge which had been generated by performing conventional mechanical flattening processing such as grinding etc. do not occur and hence it becomes unnecessary to secure a large amount of grinding in the mirror-finishing processing, and as a result, the productivity of wafer production can be improved.

While preferred embodiments of the invention have been described and illustrated above, it-should-be-understood-that-these-are exemplary of the invention and are not to be considered as limiting. Additions, omissions, substitutions, and other modifications can be made without departing from the spirit or scope of the present invention. Accordingly the invention is not to be considered as being limited by the foregoing description, and is only limited by the scope of the appended claims.

What is claimed is:

1. A process for producing a silicon wafer, comprising:
performing slicing a silicon wafer from a silicon single crystal ingot; performing etching of a first surface of said silicon wafer by a single-wafer etching step, the single-wafer etching step comprising supplying an etching solution through a nozzle to said surface of said wafer and rotating said wafer to spread said etching solution over an entire area of said surface of said wafer; and
a polishing step of polishing the etched first surface of said wafer, wherein
said single-wafer etching step flattens unevenness generated during said slicing and removes processing-deformation layer on a surface of said wafer;
said etching solution used in said single-wafer etching step is an aqueous acid solution which contains hydrogen fluoride, nitric acid, and phosphoric acid in an amount such that the content of each by weight % at a mixing ratio of hydrogen fluoride:nitric acid:phosphoric acid is 0.5 to 40%:5 to 50%:5 to 70%, respectively;
an amount of said etching solution supplied from said nozzle in said single-wafer etching step is 2 to 30 liter/mm; and
a rotating speed of said silicon wafer in said single-wafer etching step is 100 to 2000 r.p.m.,
wherein the process excludes machine polishing prior to the single-wafer etching step.

2. The process for producing a silicon wafer as set forth in claim 1, wherein a difference between a maximum thickness and a minimum thickness of said wafer is controlled to be not more than 1 µm.

3. The process for producing a silicon wafer as set forth in claim 1 further comprising a chamfering step of chamfering the end surface of said silicon wafer between said single-wafer etching step and said polishing step.

4. The process for producing a silicon wafer as set forth in claim 1, wherein said etching solution contains, in weight %, 5 to 20% of hydrogen fluoride, 20 to 40% of nitric acid, and 20 to 40% of phosphoric acid.

5. The process for producing a silicon wafer as set forth in claim 1, wherein a removal amount from said surface of said wafer in said single-wafer etching step is 5 to 75 µm.

6. The process for producing a silicon wafer as set forth in claim 1, further comprising performing etching of a second surface of said wafer opposite to said first surface by said single-wafer etching step such that said second surface of said wafer is etched after etching said first surface of said wafer.

7. The process for producing a silicon wafer as set forth in claim 2, wherein said polishing step is further performed on said second surface of said wafer.

* * * * *